United States Patent [19]
Harada et al.

[11] Patent Number: 5,481,137
[45] Date of Patent: Jan. 2, 1996

[54] SEMICONDUCTOR DEVICE WITH IMPROVED IMMUNITY TO CONTACT AND CONDUCTOR DEFECTS

[75] Inventors: Shigeru Harada; Hisao Masuda; Reiji Tamaki, all of Hyogo, Japan

[73] Assignee: Mitsubishi Denki Kabushiki Kaisha, Tokyo, Japan

[21] Appl. No.: 246,375

[22] Filed: May 18, 1994

Related U.S. Application Data

[63] Continuation of Ser. No. 80,149, Jun. 23, 1993, abandoned, which is a continuation of Ser. No. 508,507, Apr. 12, 1990, Pat. No. 5,260,604, which is a continuation of Ser. No. 249,906, Sep. 27, 1988, abandoned.

[51] Int. Cl.⁶ .......................... H01L 23/48; H01L 29/46; H01L 29/34; H01L 29/62
[52] U.S. Cl. .......................... 257/742; 257/767; 257/771
[58] Field of Search .................................. 257/742, 767, 257/771, 740, 741

[56] References Cited

U.S. PATENT DOCUMENTS

| | | |
|---|---|---|
| 3,925,808 | 12/1975 | Rai-Choudhury . |
| 4,110,783 | 8/1978 | Onodera et al. . |
| 4,289,602 | 9/1981 | Sansregret . |
| 4,328,261 | 5/1982 | Heinecke et al. . |
| 4,492,812 | 1/1985 | Lindmayer . |
| 4,502,207 | 3/1985 | Ohshima et al. . |
| 4,527,184 | 7/1985 | Fischer . |
| 4,635,091 | 1/1987 | Roger . |
| 4,899,206 | 2/1990 | Sakurai et al. . |
| 4,912,542 | 3/1990 | Suguro ................................... 257/746 |

FOREIGN PATENT DOCUMENTS

| | | |
|---|---|---|
| 0256557 | 2/1988 | European Pat. Off. . |
| 61-216445 | 9/1986 | Japan . |
| 62-235452 | 10/1987 | Japan . |
| 62-281355 | 12/1987 | Japan . |
| 62-281354 | 12/1987 | Japan . |
| 2096826 | 10/1982 | United Kingdom . |

OTHER PUBLICATIONS

T. Tatsuzawa, "SI Nodule Formation in Al–Si Metallization", pp. 138, 141 (1985).
D. Pramanik et al., "VLSI Metallization Using Aluminum and its Alloys, Part II", Solid State Technology, pp. 131, 138 (Mar. 1983).
P. Totta, et al., "SLT Device Metallurgy and Its Monolithic Extension", IBM J. Res. Develop., pp. 226, 238 (May 1969).

*Primary Examiner*—J. Carroll
*Attorney, Agent, or Firm*—Lowe, Price, LeBlanc & Becker

[57] ABSTRACT

In a semiconductor device, an impurity diffused layer serving as an active region is formed in a predetermined region of the surface of a semiconductor substrate of silicon, an underlayer insulating film is formed on the semiconductor substrate for the purpose of protecting and stabilizing the surface of the semiconductor substrate, and an interconnection electrically connected to the impurity diffused layer through a contact hole and formed on an Al-Si-Sn alloy, an Al-Si-Sb alloy or alloys having Ti added to the respective alloys, so that occurrence of an alloy pit and a silicon nodule is prevented. In addition, a completed protective film is formed on the interconnection and the underlayer insulating film and an aperture in a bonding pad region is formed in a predetermined region of the completed protective film, so that the interconnection and the bonding pad are electrically connected to each other. The proportion of silicon and other materials in the alloy are controlled to simultaneously avoid alloy pit and silicon nodule defects both at the contact hole and throughout the alloy conductor.

4 Claims, 4 Drawing Sheets

000001

SEMICONDUCTOR DEVICE WITH IMPROVED IMMUNITY TO CONTACT AND CONDUCTOR DEFECTS

This application is a continuation of application Ser. No. 08/080,149 filed Jun. 23, 1993, abandoned which is continuation of application Ser. No. 07/508,507 filed Apr. 12, 1990, now U.S. Pat. No. 5,260,604, which is a continuation of 07/249,906 filed Sep. 27, 1988 now abandoned.

BACKGROUND OF THE INVENTION

1. Field of the Invention

The present invention relates generally to semiconductor devices, and more particularly, to an improvement of the material composition of a film of an aluminum alloy used as an interconnection of the semiconductor device.

2. Description of the Prior Art

Conventionally, as materials most widely used as an interconnection of a semiconductor device, an aluminum-silicon alloy (referred to as Al-Si alloy) containing approximately 1.0 to 2.0% silicon by weight has been known.

FIG. 1 is a cross sectional view showing a schematic structure of the conventional semiconductor device using the Al-Si alloy as an interconnection material. In FIG. 1, the conventional semiconductor device comprises an impurity diffused layer 2 formed in a predetermined region of the surface of a semiconductor substrate 1 of silicon, an underlayer insulating film 3 formed for the purpose of protecting and stabilizing the surface of the semiconductor substrate 1, an interconnection 5 of the Al-Si alloy (referred to as Al-Si interconnection hereinafter) formed in a predetermined region on the underlayer insulating film 3 and electrically connected to the impurity diffused layer 2 through a contact hole 4, and a completed protective film 6 formed on the Al-Si interconnection 5 and the underlayer insulating film 3 for the purpose of protecting the surface of the semiconductor device. A contact hole 7 is formed in a predetermined region of the completed protective film 6. The region having the contact hole 7 formed therein becomes a bonding pad region for electrically connecting the Al-Si interconnection 5 to the exterior.

FIGS. 2A to 2D are cross sectional views showing steps of forming an interconnection in the conventional semiconductor device using the Al-Si alloy shown in FIG. 1 as an interconnection material. Referring now to FIGS. 2A to 2D, description is made on a method for manufacturing the conventional semiconductor device.

In FIG. 2A, an impurity diffused layer 2 serving as an active region is formed in a predetermined region of the surface of a semiconductor substrate 1 using photolithographic techniques, an ion implantation process or the like. An underlayer insulating film 3 comprising a PSG (Phospho-Silicate Glass) film or the like is then deposited on the exposed entire surface using a CVD process for the purpose of protecting and stabilizing the surface of the semiconductor substrate 1. A contact hole 4 is then formed in a predetermined region of the underlayer insulating film 3 using photolithographic and etching techniques in order to make electrical contact to the impurity diffused layer 2.

In FIG. 2B, after a film of an Al-Si alloy is deposited on the exposed entire surface using a spattering process, a vacuum evaporation process or the like, an Al-Si interconnection 5 having a desired shape is formed using photolithographic and etching techniques.

In FIG. 2C, in order to obtain good ohmic contact between the interconnection 5 and the impurity diffused layer 2, heat treatment is performed for several ten minutes at a temperature of 400° to 500° C. in an atmosphere of hydrogen or oxygen, to cause an eutectic reaction in the interface of the Al-Si interconnection in the contact hole 4 and the semiconductor substrate.

In FIG. 2D, an insulating film such as a silicon oxide film, a PSG film and a silicon nitride film is deposited on the exposed entire surface as the completed protective film 6 using a CVD process. Then, in order to electrically connect the semiconductor device (Al-Si interconnection) to the exterior, a contact hole 7 is formed in a predetermine region of the completed protective film 6 using photolithographic and etching techniques. The region having the contact hole 7 formed therein becomes a bonding pad region.

FIG. 3 is a schematic cross sectional view of a semiconductor device using a simple substance of aluminum as an interconnection material.

When the simple substance of aluminum (pure aluminum) is used as an interconnection material, there is a phenomenon that in a heat-treating process at a temperature of 400° to 500° C. for forming good ohmic contact between an interconnection 10 of pure aluminum and an impurity diffused layer 2, silicon in the impurity diffused layer 2 and aluminum included in the interconnection 10 of pure aluminum locally react with each other in a contact hole region 4, so that an alloy pit 11 occurs, as shown in FIG. 3. This is not a problem when the depth of the impurity diffused layer 2 is large. However, the finer the semiconductor device is made, the smaller the depth of the impurity diffused layer 2 becomes, i.e., 0.5 μm or less. Thus, this alloy pit 11 penetrates through the impurity diffused layer 2, so that a punch through region 12 in the impurity diffused layer 2 is formed, whereby the interconnection 10 and the semiconductor substrate 1 are short-circuited. This reaction between silicon and aluminum takes place by the mechanism that at the time of heat treatment at a temperature of 400° to 500° C., the silicon in the impurity diffused layer 2 dissolves in the interconnection 10 of pure aluminum and the aluminum enters the impurity diffused layer 2 by mutual diffusion.

Conventionally, an interconnection of an Al-Si alloy having silicon previously added thereto in excess of the limit of silicon solubility to aluminum in the vicinity of a temperature of heat treatment, as shown in FIG. 1, has been widely used as one of the measures to prevent occurrence of this alloy pit 11.

The solid solubility (the limit of solid solubility) of silicon to aluminum is 0.25% by weight at a temperature of 400° C., 0.5% by weight at a temperature of 450° C. and 0.8% by weight at a temperature of 500° C. The major trend is that the content of silicon in the Al-Si alloy which has been put into practice is slightly higher than the above described solid solubility, i.e., approximately 1.0 to 2.0% by weight.

However, even if the Al-Si alloy is used as an interconnection material as described above, the integration density of the semiconductor device is increased. Thus, as the size of a device is made finer to enter a submicron region, two large problems occur in the conventional Al-Si interconnection. More specifically, occurrence of the alloy pit in the contact hole region 4 can be prevented in heat treatment at a temperature of 400° to 500° C. performed after forming the Al-Si interconnection 5, as shown in FIG. 2C. However, other two defective modes appear.

One of the defective modes is a silicon deposition phenomenon that silicon included in the Al-Si interconnection 5 in excess is deposited in the contact hole region 4 by solid phase epitaxial growth in which substrate silicon is used as a seed crystal at the time of heat treatment. This deposited silicon 8 is close to an intrinsic semiconductor and has a very high specific resistance value. Thus, if silicon is deposited in a part or all of the contact hole 4 at a submicron level, contact resistance between the interconnection 5 and the impurity diffused layer 2 becomes very high, so that electrical failures occur.

The other defective mode is a phenomenon that silicon included in the Al-Si interconnection 5 in excess is deposited in the interconnection at a submicron level, so that a mass referred to as a silicon nodule 9 is formed. This silicon nodule 9 is close to the intrinsic semiconductor and has a very high specific resistance value. In addition, since the silicon nodule grows to the size of approximately 1 μm, a cross-sectional area of an effective interconnection is locally decreased. Thus, the current density in this portion is substantially increased, so that failures such as generation of heat by electromigration and disconnection are liable to occur.

SUMMARY OF THE INVENTION

Therefore, an object of the present invention is to solve the above described problems and to prevent deposition of silicon included in an interconnection of an aluminum alloy into a contact hole portion and occurrence of a silicon nodule in the interconnection, thereby to provide a stable and reliable semiconductor device.

The semiconductor device according to the present invention uses an alloy having at least one type of element different from silicon in the same group, in the periodic table, as that of an element constituting a semiconductor substrate added to aluminum as an interconnection material. In addition, the content of silicon in the interconnection material is suppressed to less than the solid solubility to aluminum at the time of heat treatment at a temperature of 400° to 500° C.

Since the content of silicon in the interconnection material according to the present invention is made to be less than the solid solubility, occurrence of the silicon nodule and deposition of silicon into the contact hole portion at the time of heat treatment are suppressed. In addition, the content of silicon in an interconnection of an aluminum alloy is decreased. However, the interconnection includes at least one type of element different from silicon in the same group, in the periodic table, as that of an element constituting a semiconductor substrate, so that the silicon in an impurity diffused layer is not soluble in the interconnection layer of an aluminum alloy film. Thus, aluminum does not diffuse into the impurity diffused layer, so that occurrence of an alloy pit can be prevented.

In a more preferred embodiment, a semiconductor substrate is formed of silicon, and at least one type of element in a group consisting of carbon, tin and lead is added to an interconnection layer of an aluminum alloy film. In addition, the interconnection layer of an aluminum alloy contains silicon. The content x of silicon is selected to satisfy $0 \leq x \leq 0.8$ wt. %, and the content y of elements excluding the silicon in the same group is selected to satisfy $0.2 \leq y \leq 2.0$ wt. %, and x and y are selected to satisfy $x+y \leq 2.0$ wt. %.

Still more preferably, one type of titanium, vanadium and chromium is added to an interconnection layer of an aluminum alloy film as an element having strong bond force to oxygen, the total amount z thereof being selected to satisfy $0.05 \leq z \leq 1.0$ wt. %.

According to another invention, the content of silicon in an interconnection material is decreased to less than the limit of solid solubility of silicon to aluminum when a temperature of heat treatment is reached, and at least one type of element in a group adjacent, in the periodic table, to that of an element constituting a semiconductor substrate is added in small quantities.

Thus, according to this other invention, at least one type of element similar to silicon in physical and chemical properties and in a group adjacent, in the periodic table, to that of silicon, silicon in an impurity diffused layer can not be soluble in an aluminum alloy, so that occurrence of an alloy pit can be prevented.

In a more preferred embodiment, at least one type of element in a group consisting of boron, gallium, indium, thallium, phosphorus, arsenic, antimony and bismuth is added to an aluminum alloy film. In addition, silicon is contained in the aluminum alloy film. The content x of silicon is selected to satisfy $0 \leq x \leq 0.8$ wt. % and the total amount y of addition of an element in an adjacent group is selected to satisfy $0.2 \leq y \leq 2.0$ wt. %, and x and y are selected to satisfy $x+y \leq 2.0$ wt. %.

Additionally, one type of element out of titanium, vanadium and chromium is added to an interconnection layer of an aluminum alloy film as an element having strong bond force to oxygen, the total amount z thereof being selected to satisfy $0.05 \leq z \leq 1.0$ wt. %.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
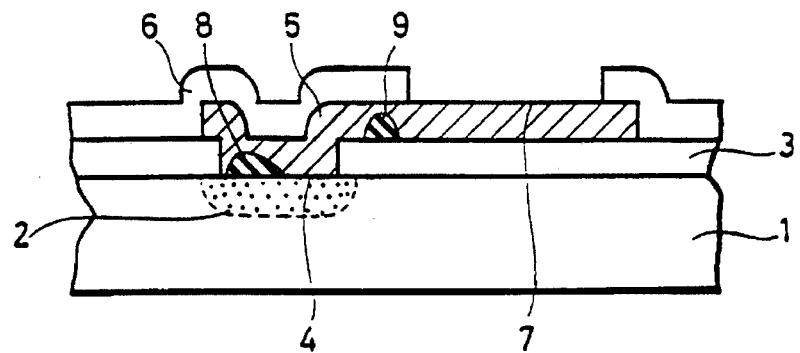
FIG. 1 is a diagram showing a schematic cross-sectional structure of a conventional semiconductor device.
Figure 3:
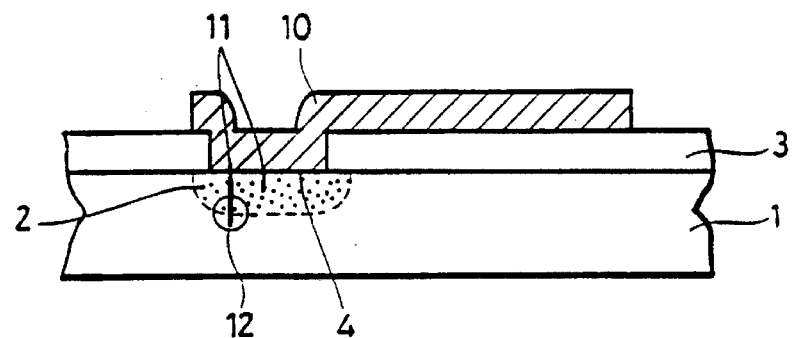
FIG. 3 is a diagram showing a schematic cross-sectional structure of the conventional semiconductor device using an interconnection of pure aluminum.
Figure 4:
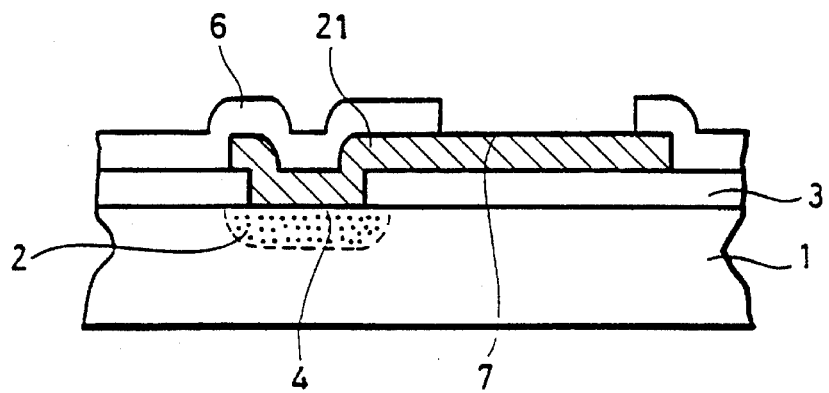
FIG. 4 is a cross-sectional view showing a schematic structure of a semiconductor device according to one embodiment of the present invention.
Figure 2A:
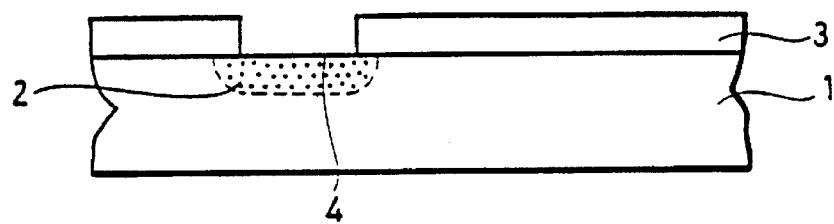
FIGS. 2A to 2D are cross-sectional views showing steps of a method for forming an interconnection in the conventional semiconductor device using an Al-Si interconnection.
Figure 2B:
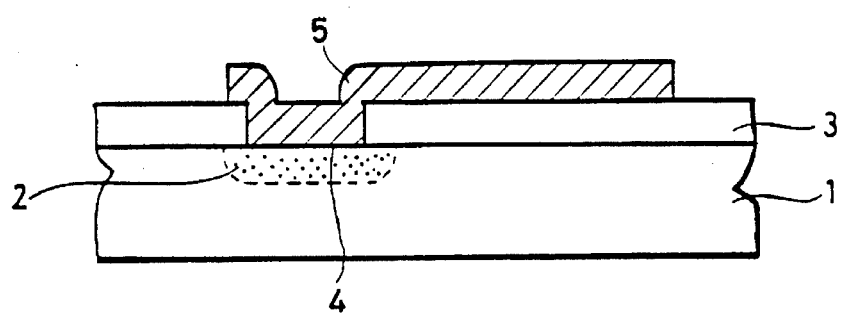
Figure 2C:
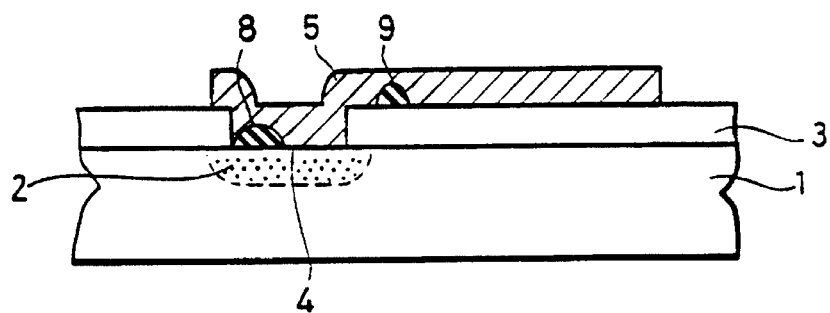
Figure 2D:
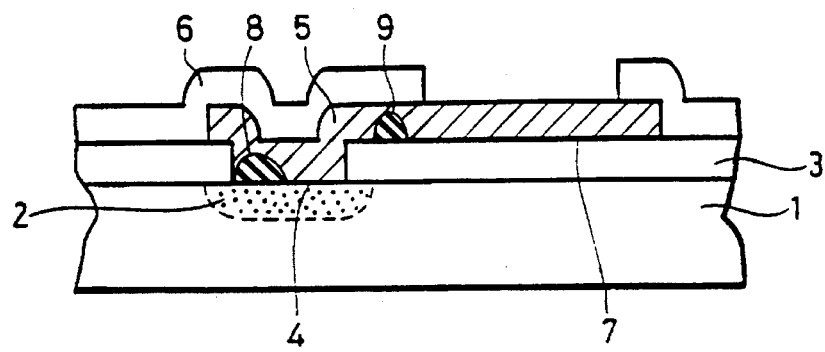

FIG. 4 is a diagram showing a schematic cross-sectional structure of a contact hole portion of a semiconductor device according to one embodiment of the present invention. In FIG. 4, the semiconductor device according to one embodiment of the present invention comprises a semiconductor substrate 1 of silicon, an impurity diffused layer 2 formed in a predetermined region of the surface of the semiconductor substrate 1 to serve as an active region, an underlayer insulating film 3 formed to protect and stabilize the surface of the semiconductor substrate 1, an interconnection 21 electrically connected to the impurity diffused layer 2 through a contact hole 4 and formed of an Al-Si-Sn alloy which can prevent occurrence of an alloy pit and a silicon nodule, and a completed protective film 6 formed on the interconnection 21 and the underlayer insulating film 3, and an aperture 7 in a bonding pad region formed in a predetermined region of the completed protective film 6 for electrically connecting the interconnection 21 to the exterior.

FIGS. 5A to 5D are cross-sectional views showing the steps of a method for forming an interconnection of the semiconductor device according to one embodiment of the present invention. Referring now to FIGS. 5A to 5D, description is made on the method for forming an interconnection of the semiconductor device according to one embodiment of the present invention.

Figure 5A:
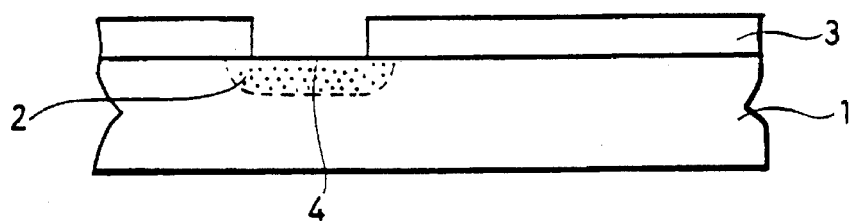
FIGS. 5A to 5D are cross-sectional views showing the steps of forming an interconnection of the semiconductor device according to one embodiment of the present invention.

In FIG. 5A, in the same manner as the conventional example, an impurity diffused layer 2 serving as an active region is formed in a predetermined region of the surface of a semiconductor substrate 1 of silicon using photolithographic techniques, an ion implantation process and the like. An underlayer insulating film 3 comprising a PSG film or the like is then formed for the purpose of stabilizing and protecting the surface of the semiconductor substrate 1. A contact hole 4 for making electrical connection to the impurity diffused layer 2 is then formed in a predetermined region of the underlayer insulating film 3 using photolithographic and etching techniques.

Figure 5B:
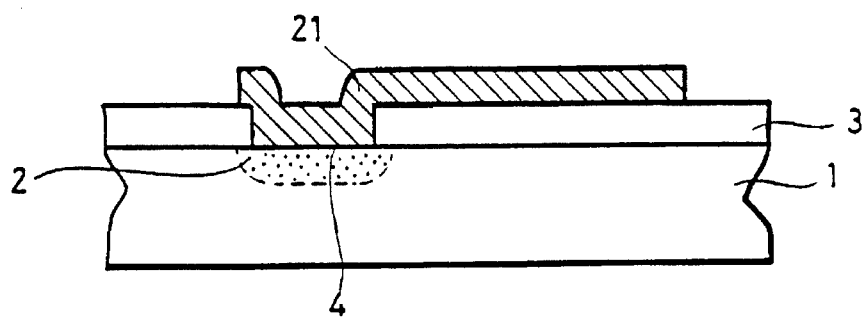

In FIG. 5B, after a film of an Al-Si-Sn alloy is deposited on the exposed entire surface using a spattering process, a vacuum evaporation process or the like and then, an Al-Si-Sn interconnection 21 having a desired shape is formed using photolithographic and etching techniques.

In order to prevent deposition of silicon in a contact hole portion and occurrence of a silicon nodule in the interconnection 21 at the time of heat treatment at a temperature of 400° to 500° C. in the following step, the content of silicon in the Al-Si-Sn interconnection 21 is set to a value of not more than solid solubility (the limit of solid solubility) of silicon to aluminum in a region at this temperature, i.e., 0 to 0.8% by weight. Considering a case in which heat treatment at a temperature of 400° to 500° C. is performed for achieving good ohmic contact in the following process, even if the content of silicon is decreased, silicon in the impurity diffused layer 2 is soluble in the interconnection, so that the above described alloy pit occurs in the impurity diffused layer 2.

In order to prevent the silicon in the impurity diffused layer 2 from being soluble in the interconnection, tin in the same group, in the periodic table, as that of silicon which is a constituent element of the semiconductor substrate 1 is added. The effect is obtained when the amount of addition of tin for preventing occurrence of the alloy pit is approximately 0.2 to 2.0% by weight depending on the content of silicon in the interconnection 21. However, the sum x+y of the amount x of addition of silicon and the amount y of addition of tin is set to 2.0% by weight or less in order to prevent deposition of silicon. In addition, tin is an element which has a property physically similar to silicon but is different from silicon. Thus, tin suppresses deposition of silicon in the contact hole 4 due to solid phase epitaxial growth of silicon. Consequently, in this respect, addition of tin is effective. In addition, tin is an element in the same group as that of silicon and tin is similar to silicon in physical and chemical properties. Thus, tin does not be a movable ion, so that tin does not adversely affect devise characteristics.

Figure 5C:
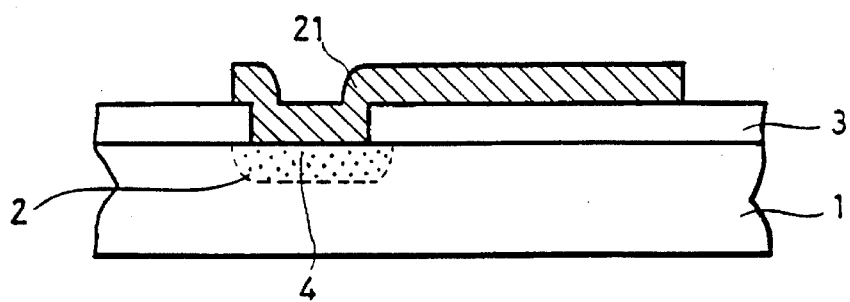

In FIG. 5C, in order to make good ohmic contact of the interconnection 21 to the impurity diffused layer 2, heat treatment is performed for several ten minutes at a temperature of 400° to 500° C. in an atmosphere of nitrogen or hydrogen, to cause an eutectic reaction in the interface of the Al-Si-Sn interconnection 21 and the impurity diffused layer 2. On this occasion, since the content of silicon in the interconnection 21 is suppressed to less than the limit of solid solubility, silicon is not deposited by solid phase epitaxial growth and no silicon nodule occurs. In addition, since silicon and tin are added such that the sum thereof is more than the limit of solid solubility in a region at this temperature, silicon in the impurity diffused layer 2 does not dissolve into the interconnection 21, so that no alloy pit occurs.

Figure 5D:
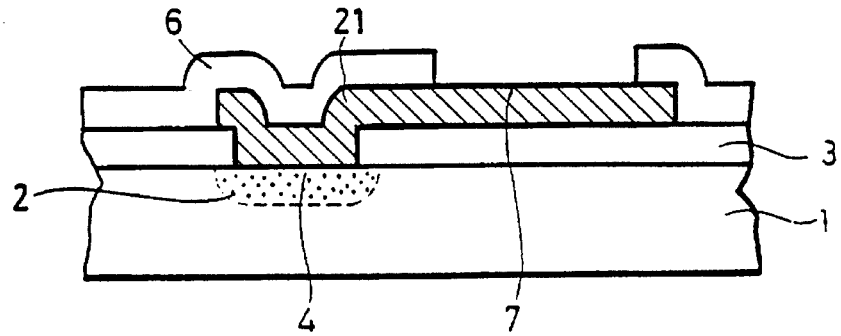

In FIG. 5D, an insulating film such as a silicon oxide film, a PSG film, a silicon nitride film is deposited on the exposed entire surface as a completed protective film 6 using a CVD process and then, an aperture 7 in a bonding pad region for electrically connecting the interconnection 21 to the exterior is formed in a predetermined region of the completed protective film 6 using photolithographic and etching techniques.

Although in the above described embodiment, description was made on a case in which tin is added as an element in the same group, in the periodic table, as that of silicon which is an element constituting a semiconductor substrate is used as an interconnection material, another element in the same group, i.e., carbon and lead may be added. Also in this case, the element of 0.2 to 2.0% by weight may be added depending on the content of silicon in the interconnection, to obtain the same effect as that of the above described embodiment.

Additionally, although in the above described embodiment, a ternary alloy having one type of element different from silicon in the same group as that of an element constituting a semiconductor substrate added to an Al-Si alloy is used as an interconnection material, an alloy including multiple elements having a plurality of elements in the same group added thereto may be used as an interconnection material. In this case, the total amount of addition of the elements in the same group may be 0.2 to 2.0% by weight depending on the content of silicon in an interconnection, to obtain the same effect as that of the above described embodiment.

Additionally, silicon need not be added. For example, a binary alloy having at least one type of element different from silicon in the same group as that of an element constituting a semiconductor substrate or an alloy including multiple elements added to pure aluminum may be used as an interconnection material, to obtain the same effect as that of the above described embodiment.

As described in the foregoing, according to one embodiment of the present invention, since an aluminum alloy having a reduced content of silicon in a simple substance of aluminum or an Al-Si alloy and having at least one type of element different from silicon in the same group as that of an element constituting a semiconductor substrate added thereto was used as an interconnection material in the semiconductor device, occurrence of an alloy pit and deposition of silicon in a contact hole portion and occurrence of a silicon nodule in the interconnection in a heat-treating process after forming an interconnection of an aluminum alloy can be prevented and an electrical short between the interconnection layer and the semiconductor substrate due to a punch through phenomenon of an impurity diffused layer, the increase in contact resistance, the decrease in electromigration resistance and the like can be prevented, whereby a stable and reliable semiconductor device can be achieved.

In another embodiment of the present invention, a small quantity of antimony similar to silicon in physical and chemical properties, i.e., an element in a group adjacent, in the periodic table, to that of silicon is added in order to suppress the solubility of silicon from an impurity diffused layer 2 into an interconnection. The effect is obtained when the amount of addition of antimony for preventing occurrence of an alloy pit is approximately 0.2 to 2.0% by weight depending on the content of silicon in the interconnection of an alloy. More specifically, the sum of the content of silicon in an interconnection of an alloy and the content of antimony is preferably set to 1.0 to 2.0% by weight.

In this case, if a too large quantity of antimony is added, new problems occur. For example, interconnection resistance is increased, and silicon is deposited. In addition, since antimony is an element physically similar to silicon but different from silicon, silicon is not deposited in a contact hole portion 4 by solid phase epitaxial growth in which substrate silicon is used as a seed crystal. In this respect, antimony is an effective element. In addition, since the degree of deposition of antimony is negligible, as compared with that of silicon and antimony does not be a movable ion, antimony added in small quantities does not adversely affect device characteristics.

In a manufacturing method according to the present embodiment, a film of an Al-Si-Sb alloy is deposited on the underlayer insulating film 3 and the contact hole 4 using a spattering process, a vacuum evaporation process or the like, in FIG. 5B in the above described embodiment. On this occasion, the content of silicon in the film of an alloy is 0 to 0.8% by weight, and the content of antimony therein is approximately 0.2 to 2.0% by weight depending on the content of silicon. The film of an Al-Si-Sb alloy is then patterned in a predetermined shape using photolithographic and etching techniques, so that an Al-Si-Sb interconnection 21 is formed.

Then, processing shown in FIG. 5C is performed, which is the same as that in the above described embodiment. In FIG. 5C, since the content of silicon in the interconnection 21 is decreased to less than the solid solubility in a region at the temperature and a small quantity of antimony which is similar in physical and chemical properties to silicon is added, silicon is not deposited in the contact hole portion 4 by solid phase epitaxial growth and no silicon nodule occurs in the interconnection 21. Processing shown in FIG. 5D is the same as that in the above described embodiment.

Although in the above described embodiment, description was made on a case in which antimony is used as an element added to the interconnection 21 of an alloy, any of boron, gallium, indium, thallium, phosphorus, arsenic, antimony and bismuth which are other elements may be used, to obtain the same effect as that in the above described embodiment can be obtained. Also in this case, the element of 0.2 to 2.0% by weight may be added depending on the content of silicon in the interconnection of an alloy, to obtain the same effect.

Furthermore, although in the above described embodiment, description was made on a case in which a ternary alloy having one kind of element in a group adjacent to that of silicon added to an Al-Si alloy, an alloy including multiple elements having a plurality of elements in the adjacent group added thereto may be used. In this case, the total amount of the added elements excluding silicon may be 0.2 to 2.0% by weight, to obtain the same effect.

Additionally, silicon need not be added. For example, a binary alloy having one type of element in Group III or V added to pure aluminum and an alloy including multiple elements having a plurality of types of elements in Groups III and V without adding silicon may be used as an interconnection material, to obtain the same effect.

According to the above described embodiment, when one kind of element or a plurality of kinds of elements in the same or the adjacent group, in the periodic table, as or to the element constituting the semiconductor substrate are added in order to decrease the solid solubility of silicon, deposition of the silicon 8 into the contact hole portion 4 and deposition of the silicon nodule 9 into the interconnection layer 5 can be prevented, respectively. On the other hand, when adhesion of the PSG film or the like to the underlayer insulating film 3 is prevented, resulting in wire bonding, the interface of the interconnection layer portion 5 in the aperture 7 in the bonding pad region 5 and the underlayer insulating film 3 is liable to be stripped off. Description is now made on an embodiment in which such a problem is solved.

Figure 6:
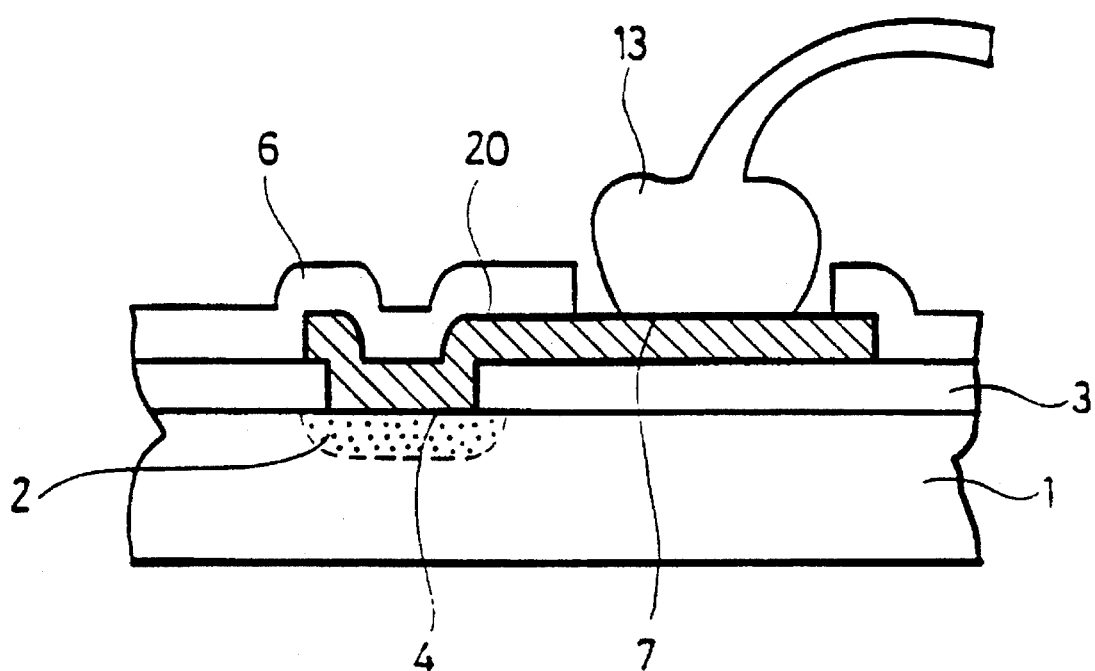
FIG. 6 is a diagram showing a schematic cross-sectional structure of a semiconductor device according to another embodiment of the present invention.

FIG. 6 is a diagram showing a schematic cross-sectional structure of a semiconductor device according to another embodiment of the present invention. The embodiment shown in FIG. 6 is the same as the above described embodiment shown in FIG. 4 except that the interconnection 21 of an Al-Si-Sn alloy or an Al-Si-Sb alloy is replaced with an Al-Si-Sn-Ti interconnection layer 20. In addition, the manufacturing process in the embodiment shown in FIG. 6 is the same as that in FIGS. 5A to 5D except that interconnection materials are different from each other.

In the present embodiment, the content of silicon in an interconnection material of an Al-Si-Sn-Ti alloy is suppressed to approximately 0 to 0.8% by weight in order to prevent deposition of silicon 8 in a contact hole portion 4 and deposition of a silicon nodule 9 in the interconnection layer in heat treatment at a temperature of 400° to 500° C., as in the above described embodiment. In such a case, silicon in an impurity diffused layer 2 is soluble in the interconnection layer, so that an alloy pit 11 occurs. Thus, in order to decrease the solid solubility of silicon in the interconnection layer, any of tin, carbon and lead in the same group, in the periodic table, as that of silicon constituting the semiconductor substrate 1 is added. On this occasion, the content of tin or the like in the alloy is selected to be approximately 0.2 to 2.0% by weight, depending on the content of silicon.

Additionally, in order to prevent stripping in the interface of the interconnection layer in an aperture 7 in a bonding pad region and an underlayer insulating film 3 and improve adhesion, titanium the content of which is approximately 0.05 to 1.0% by weight is added to the alloy. Since titanium has very strong bond force to oxygen, adhesion of an oxide film system such as a PSG film to the underlayer insulating film 3 can be considerably improved. More specifically, an interconnection material of an Al-Si-Sn-Ti alloy is used as an interconnection layer 2D, occurrence of the alloy pit 11, deposition of the silicon 8 into the contact hole portion 4 and occurrence of the silicon nodule 9 which were problems in the conventional example can be effectively prevented and adhesion of an oxide film system such as the PSG film or the like to the underlayer insulating film 3 can be improved.

Although in the above described embodiment, description was made on a case in which titanium is added to the Al-Si alloy, it should be noted that the present invention is not limited to the same. For example, vanadium and chromium having strong bond force to oxygen like titanium may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor layer having a predetermined element as a constituent element thereof, an impurity diffused layer formed in a predetermined region of said semiconductor layer of said semiconductor device, and an interconnection layer of an aluminum alloy film having aluminum as the major constituent and formed on at least said impurity diffused layer so as to receive and send electrical signals from and to said impurity diffused layer, said interconnection layer of the aluminum alloy film including at least one element in elemental form from a first group consisting of boron, gallium, indium, thallium, phosphorus, arsenic, antimony and bismuth, the content of at least one element defined as y, said interconnection layer of the aluminum alloy film further including silicon, the content of silicon in the interconnection layer defined as x, wherein x is selected to satisfy $0<x<0.8$ wt. %, y is selected to satisfy 0.2 wt. %$<y<$2.0 wt. % and $x+y<2.0$ wt. % substantially throughout said aluminum alloy film.

2. The semiconductor device according to claim 1, wherein the predetermined element of said semiconductor layer comprises silicon.

3. The semiconductor device according to claim 1, wherein said interconnection layer of the aluminum alloy film comprises at least one element from a second group consisting of titanium, vanadium and chromium.

4. The semiconductor device according to claim 3, wherein the total amount of said element of said second group is z and z is selected to satisfy $0.05 \leq z \leq 1.0$ wt. %.

* * * * *